United States Patent [19]

Hallman et al.

[11] 4,289,071
[45] Sep. 15, 1981

[54] SHALLOW RELIEF NON-BOTTOMING PHOTOPOLYMER PRINTING PLATE

[75] Inventors: Robert W. Hallman, San Diego; Koichi Kimoto, Oceanside; Sakuo Okai, Carlsbad, all of Calif.

[73] Assignee: Napp Systems (USA), Inc., San Marcos, Calif.

[21] Appl. No.: 74,700

[22] Filed: Sep. 12, 1979

Related U.S. Application Data

[63] Continuation of Ser. No. 863,775, Dec. 23, 1977, abandoned.

[51] Int. Cl.³ .................. B41N 1/06; B41C 1/00
[52] U.S. Cl. ..................... 101/395; 101/401.1; 101/459; 430/300; 430/348
[58] Field of Search ............ 101/457, 459, 395, 401.1; 430/510, 300, 348

[56] References Cited

U.S. PATENT DOCUMENTS

| | | | |
|---|---|---|---|
| 2,555,319 | 6/1951 | Cross | 101/420 |
| 3,067,056 | 12/1962 | Remer | 101/153 |
| 3,164,087 | 1/1965 | Owen | 101/425 |
| 3,279,367 | 10/1966 | Brown | 101/170 |
| 3,345,942 | 10/1967 | Meltz | 101/348 |
| 3,433,638 | 3/1969 | Ohi | 430/510 |
| 3,455,239 | 7/1969 | Smith | 101/395 |
| 3,515,584 | 6/1970 | Yang | 101/395 |
| 3,536,008 | 10/1970 | Ritzerfeld | 101/459 |
| 3,645,204 | 2/1972 | Gosnell | 101/395 |
| 3,696,741 | 10/1972 | Reinke | 101/128.3 |
| 3,711,859 | 1/1973 | Brown et al. | 101/DIG. 13 |
| 3,942,440 | 3/1976 | Ritzerfeld | 101/401.1 |
| 4,000,334 | 12/1976 | Hallman et al. | 430/348 |
| 4,046,071 | 9/1977 | Mizuno | 430/300 |
| 4,098,188 | 7/1978 | Stroszynski | 430/300 |

OTHER PUBLICATIONS

Uhlig, The Journal of Photographic Science vol. 18, 1970, No. 1, Jun./Feb. 1970, pp. 4-7.

*Primary Examiner*—Clyde I. Coughenour
*Attorney, Agent, or Firm*—Hosier, Niro and Daleiden

[57] ABSTRACT

A shallow relief non-bottoming printing plate is disclosed having a polymerized layer of less than about 0.020 inch and which includes a plurality of dispersed particles sufficient to create small protuberances in non-image or background areas to prevent bottoming. Photopolymerizable elements, as well as processing techniques, are also disclosed for making such printing plates.

5 Claims, 2 Drawing Figures

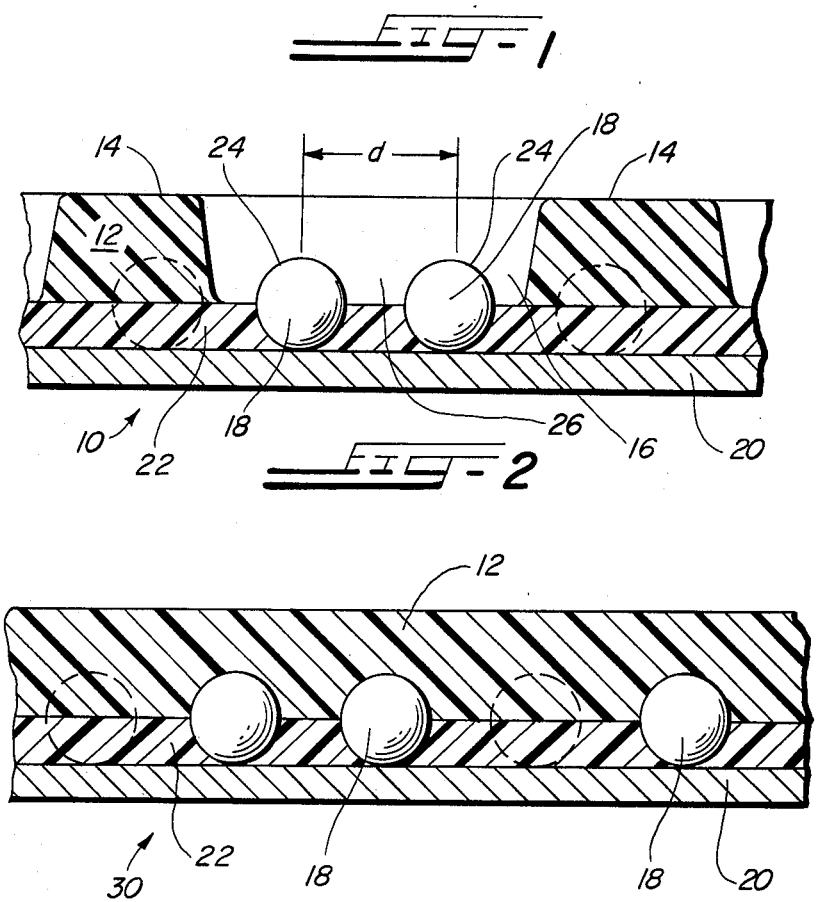

SHALLOW RELIEF NON-BOTTOMING PHOTOPOLYMER PRINTING PLATE

RELATED APPLICATION

This is a continuation application of application Ser. No. 863,775, filed Dec. 23, 1977 now abandoned.

BACKGROUND AND SUMMARY OF THE INVENTION

The present invention relates generally to photopolymerizable printing plates useful, for example, in letterpress and related printing operations, and more particularly to shallow relief, non-bottoming photopolymer printing plates and methods for making and using such plates.

Photopolymer printing plates have found widespread and successful use in letterpress printing processes, particularly in the newspaper industry. Conventional photopolymer plates hold many advantages over prior art, metal etched printing plates. The time required to make the photopolymer plates, for example, is considerably shorter and, with the introduction of water developable photopolymers, problems relating to environmental contamination have been significantly reduced. In addition, photopolymer plates are much easier to handle and can be more readily and efficiently developed and processed than metal etched plates.

Despite their widespread acceptance in the industry, however, photopolymer plates do suffer from the disadvantage of being relatively expensive, particularly when compared to the plates used in stereotype systems utilized by some of the large newspapers. Thus, there is a need in the industry for a less expensive photopolymer printing plate which will enable photopolymer printing systems to more efficiently compete with existing stereotype systems.

Conventional photopolymer printing plates utilize photosensitive materials which are deposited on a supporting substrate such as metal or plastic. Experience has shown that acceptable printing quality can often only be accomplished when such photopolymer plates utilize photosensitive layers having a thickness greater than 0.020 inch. Without such relatively thick photopolymer layers, and the resultant high relief image areas that they produce, "bottoming", e.g., the unwanted printing on white or non-image background areas, often results when thinner plates are used in letterpress machines.

Although a number of techniques have evolved in an effort to solve this "bottoming" problem, none has proven to be entirely satisfactory. Obviously, the use of thick photopolymer layers of 0.020 inch or more is undesirable because of the added expense that is caused through use of more photopolymer.

In some cases, ink repellant materials or even separate layers of ink repellant compositions have been incorporated in thinner photopolymer plates so that the non-image, background areas after development tend to reject any unwanted accumulation and subsequent deposit of ink in white or background areas. The disadvantage of such techniques, of course, is that significant additional expense is added to the resultant plate (even where thinner photopolymer layers can be employed) because of the special ink repulsive layers, additional materials and additional manufacturing costs that are required.

In other cases, highly expensive special printing presses and extreme care in printing are required to minimize the bottoming problem. Attempts have even been made to overcome the bottoming problem by depositing a thin layer of photopolymer, exposing the first layer of photopolymer with a screen dot negative to create a series of small polymerized areas for background, and then depositing a second layer of photopolymer material over the first layer for use in creating image areas. Such techniques, although partially useful in reducing the overall thickness of the resultant photopolymer layer, have the disadvantage of adding significant expense and of unnecessarily complicating the plate manufacturing process.

Finally, grained substrates have heretofore been used in the printing arts for purposes other than the prevention of "bottoming" in photopolymer plates, but these teachings are of little or no value in the context of the present invention. Grained substrates have been used in lithographic plates, for example, to aid in making improved water receptive surfaces. Similarly, grained substrates have been used to strengthen metal printing foils or the like so that localized deformations caused by means of a typewriter, pen, pencil, embossing plate or the like will not cause the foil to be split, torn or creased.

The problem, of course, with all such prior art techniques is that: (1) they fail even to recognize the nature and extent of "bottoming" problems that can occur in relatively thin photopolymer plates, and (2) they fail to provide a practical, inexpensive solution to the "bottoming" problem, and more specifically a solution that permits careful, but simplified, control over the height, size, density and spacing of background protuberances which applicants have found useful in eliminating the "bottoming" problem.

In accordance with the present invention, therefore, a photopolymer printing plate is provided having a photopolymer layer that is substantially less thick, and thus far less expensive, than prior art photopolymer printing plates. Moreover, the printing plates of the present invention can not only be easily manufactured without adding significant time and expense to normal manufacturing techniques, but can be used on letterpress machines to produce printing material of high quality without unwanted bottoming occuring in background areas.

The present invention, therefore, is generally directed to shallow relief, non-bottoming photopolymer printing plates comprising (a) a substrate, (b) a binder layer coated on the substrate having a plurality of selected dispersed particles that create an array of selected protuberances in the background areas of the plate, and (c) a relatively thin photopolymer layer that is coated on the binder layer, which upon development, provides the desired raised image or relief areas of the resultant plate. The present invention is further directed to photopolymerizable elements, to methods for making and processing such elements to provide the desired shallow relief, non-bottoming printing plates, and to printing processes which advantageously utilize the shallow relief, non-bottoming plates of the present invention.

BRIEF DESCRIPTION OF THE DRAWINGS

The novel features which are believed to be characteristic of the present invention are set forth in the appended claims. The invention itself, however, together with further objects and attendant advantages thereof, will be best understood by reference to the following description of various embodiments of the invention taken in connection with the accompanying drawings, in which:

FIG. 1 is an enlarged cross-sectional view of a shallow relief, non-bottoming printing plate made in accordance with the present invention; and FIG. 2 is a cross-sectional view of a photopolymerizable element which may be utilized in accordance with the present invention to provide a shallow relief, non-bottoming printing plate.

It should be noted that FIGS. 1 and 2 are primarily illustrative representations, and the sizes and shapes of the various layers, substrate particles, and other components shown therein are not intended to limit the scope of the invention as further described hereinbelow and as set forth in the appended claims.

DETAILED DESCRIPTION OF EMBODIMENTS

The shallow relief, non-bottoming printing plates of the present invention comprise a substrate, a binder layer carried by the substrate which imparts a controlled degree of surface roughness to the background areas of the developed plate, and a photopolymerized layer of photopolymer carried by the binder layer which upon development accounts for the raised image of relief areas of the plate. As set forth in greater detail hereafter, the non-bottoming characteristics of the shallow relief printing plates of the present invention result from the surface roughness characteristics of the background areas of the developed plate, which, in turn, are carefully controlled through and dependent upon the size, density, spacing and type of particles dispersed in the binder layer, and the thickness and character of the binder layer itself.

As shown, for example, in FIG. 1, the shallow relief, non-bottoming printing plate 10 of the present invention has a photopolymer layer 12 which has been photopolymerized and developed with a suitable solvent to provide raised image areas 14. In accordance with the present invention, the background areas 16 of the developed plate include a plurality of dispersed particles 18 that are held in place on substrate 20 by means of a separate binder layer 22. Substrate 20 can be a metal, such as aluminum, tin or steel, a synthetic polymer, such as a polyester, a paper sheet or other materials known to those skilled in the art.

Binder layer 22 desirably has a balance of particular properties useful in the practice of the present invention. It is preferably compatible with the particular photopolymer 12 used, it readily adheres to both the substrate and photopolymer; it secures the dispersed particles 18 in a fixed position and it does not wash away when the photopolymer layer 12 is developed, e.g., is substantially insoluble in the solvent used to develop the photopolymer. Although any material which meets the above-mentioned criteria could be used in formulating the binder layer, the following compositions, among others, have been found to be particularly advantageous when the photopolymer layer is a highly desirable waterdevelopable photopolymer of the type disclosed in U.S. Pat. No. 3,801,328: polyesters, polyurethanes, polyethylene-butadiene copolymers, polyvinyl acetate derivates, polyamides, epoxy resins, styrene-butadiene copolymers, mixtures of such copolymers and partially hydrolyzed polyvinyl acetate, unsaturated polyesters made, for example, from diethylene glycol, maleic anhydride and phthalic anhydride, mixtures of such polyesters and partially hydrolyzed polyvinyl acetate, and mixtures of glyoxal and partially hydrolyzed polyvinyl acetate.

The particles 18 that are dispersed in the binder layer 22 are desirably of relatively uniform size and should be sufficiently large to impart the desired surface roughness, but not so large as to make the resultant printing plate too thick (and thus unnecessarily expensive) or so large that they are incapable of being firmly held in a secure position by a relatively thin layer of binder. It has been determined that generally spherically-shaped particles having an average diameter (e.g., particle size) of between about 5 to 70 microns, and preferably 20 to 40 microns, provide the desired array of selected protuberances and surface roughness when dispersed in a binder layer having an overall thickness less than the average height of the dispersed particles. The use of particles having particle sizes in the desired ranges tend to create a plurality of spaced protuberances in the background areas of the developed plate of average diameter between 5 and 70 microns, and most preferably between 20 and 40 microns. Although any number of particle materials are suitable for use in the present invention, glass, "Teflon" polytetrafluroethylene, and alumina beads have been found to be particularly suitable, and "Teflon" most suitable because of its ink repellant characteristics.

It should be noted that the undesired "bottoming" is effectively eliminated in the printing plates of the present invention because of the surface roughness characteristics created in the background areas of the developed plates by reason of the selected particles dispersed in the binder layer. The use of ink repellant particles, of course, enhances this non-bottoming effect by preventing ink from depositing on the surfaces 24 of the particles, and instead accumulating, if at all, in the recess areas 26 between adjacent particles 18.

The spacing or average distance between particles 18, therefore, is most preferably controlled in the practice of the present invention because the spacing or average distance between dispersed particles 18 also affects the extent to which the unwanted bottoming can be eliminated. It has been found, for example, that when the spacing "d" between adjacent particles is too large, ink which accumulates between the particles can transfer to paper during printing to cause bottoming. On the other hand, if the concentration of particles is too high, and the resultant spacing "d" too small, binder 22 is incapable of keeping the particles in place.

A number of competing considerations, therefore, determine the ideal density and concentration of dispersed particles 18 for any given application. The particles should be sufficiently close to permit surface tension effects to hold accumulated ink between adjacent particles, rather than transferring to paper during the printing cycle. At the same time, the spacing should not be so close as to eliminate the effect of antihalation materials dispersed in the binder layer 22 or so close that the binder 22 is incapable of holding the dispersed particles in place.

It has been determined for most applications that the average distance "d" between the dispersed particles 18 should desirably be maintained between about 5 microns to 1,000 microns, and most preferably between about 30 microns and 400 microns in order to achieve the desired balance of properties set forth above. The average distance between dispersed particles and the height of the desired protuberances (e.g., surface roughness) can be effectively measured using a surface profile meter which scans the surface of the plate before application of the photopolymer layer and provides a plot of the height and spacing of surface protuberances. For any given selection of particles, binder and photopolymer, therefore, the most effective density of particles to eliminate bottoming can be selected in accordance with the present invention.

As noted above, antihalation compositions, such as red iron oxide, can also be dispersed in binder layer 22 together with the dispersed particles 18 used to eliminate the "bottoming" problem. By incorporation of such antihalation compositions directly into the binder layer, the costly and time consuming dichromate treatment or other forms of antihalation treatment of the substrate 20 can be eliminated, thus reducing overall plate manufacturing time and cost. Further savings can be achieved through the present invention because relief image 14 of lesser height than conventionally required to eliminate bottoming is required, and thus, a lesser amount of photopolymer 12 is required to manufacture each plate. In that regard, photopolymer layers 12 in the range of about 9 to 16 mils, as contrasted with equivalent layers of 20 mils in conventional photopolymer plates, have been found to be suitable for use in letterpress applications without the adverse effects of "bottoming" occuring in background areas. The substrate 20 is typically between about 8 to 10 mils in thickness, and the binder layer 22 between about 5 to 60 microns in thickness, with the particles 18 projecting above the binder layer as discussed above.

Because the printing plates of the present invention are less thick and utilize less photopolymer than conventional photopolymer printing plates, they can be more readily processed in lesser time than is required to process conventional photopolymer plates. Indeed, it has been determined that printing plates manufactured in accordance with the teachings of the present invention can be exposed, washed-out, and dried in as little as 4½ minutes per plate, in comparison to 7 or more minutes per plate for conventional photopolymer plates, which results in a substantial savings to persons employing such plates in their printing operations.

In order to produce the photopolymerizable element 30 shown in FIG. 2, selected quantities of antihalation and non-bottoming particles (e.g., iron oxide and glass, "Teflon" or alumina beads) are dispersed in the binder and coated onto substrate 20. Then after drying a suitable photopolymer layer 12 is cast onto the plate over binder layer 22, smoothed and then dried.

It should be appreciated that the present invention is not directed to any specific photosensitive composition, binder composition, support material or combinations thereof; rather, the present invention is directed to the utilization of any or all conventional photosensitive compositions and substrate materials in the manner disclosed herein to provide shallow relief, non-bottoming printing plates. In addition, other conventional techniques such as the use of separate antihalation and adhesive layers, the etching or abrasion of substrate surfaces, the use of bump exposure or $CO_2$ conditioning, and post exposure curing and treatment of the resultant printing plates may be used in conjunction with the shallow relief, non-bottoming printing plates disclosed herein and their methods of production and use.

Practical embodiments of the present invention are illustratively shown in the following examples, wherein all percentages and parts are by weight unless otherwise indicated.

EXAMPLE 1

A. Partially saponified polyvinyl acetate (average polymerization degree, 500; saponification degree, 82.0 mol%) (14 parts) is added to 86 parts of water at 60° C. under stirring. Temperature is raised to 90° C. and the solution is stirred for one hour.

B. Red iron oxide (PN 5097, Pfizer Co.) (50 parts) is mixed well by means of ball-milling with 50 parts of 20 percent of partially saponified polyvinyl acetate (average polymerization degree, 500; saponification degree, 82.0 mol%) in water for 24 hours.

EXAMPLE 2

Carboxylated styrene-butadiene copolymer emulsion (Dow Latex SD-655 solids percent 44%) (20 parts) is added slowly to 67 parts of partially saponified polyvinyl acetate solution which is described in Method A under stirring, and agitation is continued for 30 minutes. Then, 3 parts of red iron oxide solution which is described in Method B, and 10 parts of Teflon powder (maximum particle size, 30 microns) are added to the resulted solution and the solution is stirred for 30 minutes. This solution is cast on an oil-free 10-mil thick aluminum plate and dried for 2 minutes at 180° C. to form the layer 35 microns in thickness.

EXAMPLE 3

Carboxylated styrene-butadiene copolymer emulsion (Dow Latex SD-655) (17 parts) is added slowly to 75 parts of partially saponified polyvinyl acetate solution which is described in Method A under stirring, and agitation is continued for 30 minutes. Then, 3 parts of red iron oxide solution which is described in Method B, and 5 parts of Glass beads (maximum particle size, 50 microns) are added to the resulted solution and the solution is stirred for 30 minutes. This solution is cast on an oil-free 6.5-mil thick Tin plate and dried for 2 minutes at 180° C. to form the layer 35 microns in thickness.

EXAMPLE 4

Methylated methylol melamine in water (commercial name; Resloom M-75, solid 60%, by Monsanto Co.) (0.5 part) is added to 87 parts of 20 percent of partially saponified polyvinyl acetate (average polymerization degree, 500; saponification degree; 88.0 mol%) in water, and 3 parts of red iron oxide solution which is described in Method B and 10 parts of Teflon powder are added to this solution. After 30 minutes agitation, 0.2 part of p-Toluene sulfonic acid is added to the resulted solution and the solution is stirred for 15 minutes. This solution is cast on an oil-free 10-mil thick aluminum plate and dried for 2 minutes at 160° C. to form the layer 35 microns in thickness.

EXAMPLE 5

Red iron oxide solution (3 parts) which is described in Method B and 3 parts of dispersible Alumina (commercial name: Dispal M, by Philadelphia Quartz Co.) are added to 65 parts of 20 percent of partially saponified polyvinyl acetate (average polymerization degree, 500; saponification degree, 82.0 mol%), and the solution is stirred for 30 minutes. Twenty-nine parts of Glyoxal (40%) is added to the resulted solution under stirring and the solution is stirred for 15 minutes. This solution is cast on an oil-free 10-mil thick aluminum plate and dried for 3 minutes at 180° C. to form the layer 50 microns in thickness.

EXAMPLE 6

Diethylene glycol (23 parts), maleic anhydride (10 parts) and phthalic anhydride (15 parts) are added into four-necked flask and materials are heated slowly to 150° C. under Nirtogen atmosphere and the temperature is raised to 190° C. After the mixture is reacted at 190° C. for 1 hour, unreacted materials are evaporated under reduced pressure (150 mm Hg). Hydroquinone (0.002 part) is added to the reactants at 100° C. Molecular weight of this unsaturated polyester is 1000 and acid value is 20.

Thirty-six parts of the unsaturated polyester which is mentioned above and 5 parts of styrene are dissolved in 55 parts of xylene and 0.1 part of benzoin isopropylether is added to the resulted solution. After the solution is stirred for 15 minutes, 4 parts of Glass beads (maximum particle size, 50 microns) is added and agitation is done for 15 minutes. This solution is cast on a cleaned 7-mil thick polyester film and dried for 5 minutes at 130° C. to form the layer 55 microns in thickness. After the film was dried, this is exposed to U.V. light (medium pressure Hg lamp; distance 4 feet) for 1 minute.

EXAMPLE 7

A mixture of partially saponified polyvinyl acetate (average polymerization degree, 500; saponification degree, 82.0 mol%) (35 parts), water (30 parts) and Rose bengal (50 ppm of all components by weight) is kneaded in a kneader at 80° C. to 90° C. for 30 minutes. Then, this mixture is cooled to 60° C. and a mixture of diethylene glycol dimethacrylate (10 parts), B-hydroxyethyl methacrylate (24 parts), hydroquinone (0.1 percent of total monomer by weight) and benzoin iso-propyl ether (1.0 part) is added and stirred for 30 minutes. The resulted photopolymerizable composition is cast on the plate which is described in Example 2. A polyester sheet is placed thereon and the resulted piled produce is passed between two rolls. After cooling, the polyester sheet is peeled off and the plate and dried in a dryer at 75° C. for 30 minutes to form a photosensitive layer 11 mils in thickness.

EXAMPLE 8

Polyalkyleneoxide which includes at least one ethylenic unsaturated group (XD-8753 by Dow Chemical) (100 parts), diacetone acrylamide (15 parts), pentaerythritol tetraacrylate (5 parts), benzoin iso-propylether (2 parts) and p-benzoquinone (0.02 part) are mixed and heated to 70° C. Then, 16 parts of glyoxal (65%) which is preheated to 70° C. is added to the mixture and followed by quick mixing. The resulted mixture is immediately coated on the plate which is described in Example 3 with a doctor blade and the plate is dried in a dryer at 70° C. for 15 minutes to form photosensitive layer 10 mils in thickness.

EXAMPLE 9

The unsaturated polyester (80 parts) which is prepared by the method in Example 6, 10 parts of diacetone acrylamide, 10 parts of B-hydroxyethyl methacrylate, 15 parts of styrene are mixed well at room temperature. Two parts of Benzoin iso-propylether and 0.02 part of p-benzoquinone are added to the mixture and the resulted solution is stirred for 30 minutes. This photosensitive material is poured on the plate which is described in Example 6 before processing. The photosensitive composition is squeezed with a doctor blade to form photosensitive layer 16 mils in thickness. A negative film is placed thereon and the resulted piled material is exposed to a 3,000 watt high pressure mercury arc for 50 seconds from a distance of 20 inches. After exposure, the negative film is stripped from the plate and the unexposed material is washed away with 0.2% caustic soda (temperature, 40° C.) under the pressure of 30 psi for one minute and followed by drying for 2 minutes at 120° C. to give a relief 11 mils in thickness. The printing was carried out with a Vandercook letterpress printing machine (Universal III) using an ink for letterpress (Flint Ink Co.), and showed excellent image quality without any smutting on non-image area.

EXAMPLE 10

The photopolymer plate made according to Example 7 is placed in a vacuum frame and exposed to a 3,000 watt high pressure mercury arc for 3 seconds from a distance of 20 inches. Then, a negative film is placed on the photopolymer plate and the plate is exposed to same actinic light through the negative film for 35 seconds. After exposure, the negative film is stripped from the plate and the unexposed material is washed away with water (temperature, 45° C.) under the pressure of 40 psi for 2 minutes. The printing plate is dried at 120° C. for 2 minutes to give a sharp relief printing plate.

The printing was carried out with a Vandercook letterpress printing machine (Universal III) using an ink for letterpress (Flint Ink Co.) and showed excellent image quality without any smutting on non-image area.

EXAMPLE 11

A negative film is placed on the photosensitive plate made according to Example 8 and the plate is exposed to a 3,000 watt high pressure mercury arc for 2 minutes from a distance of 20 inches. After exposure, the negative film is stripped from the plate and the unexposed material is washed away with 0.3% caustic soda (temperature 40° C.) under the pressure of 30 psi for one minute. The printing plate is dried at 120° C. for 2 minutes to give a sharp relief printing plate. The printing was carried out by the same method as described in Examples 9 and 10, and showed excellent image quality without any smutting or bottoming on non-image area.

EXAMPLE 12

The average distance between dispersed particles and the height of protuberances for printing plates made in accordance with Examples 1–11 are measured using a surface profile meter (Dektak by Sloan). The 1 cm×1 cm sample is put on a sample holder and the surface is scanned at the speed of 0.1 cm/min. The correlation of the nature of "non-bottoming" and the distance between dispersed particles or size of particles was investigated using different concentrations of particles and different sizes of particles. The suitable range of average distance between two particles is 5 microns through 1,000 microns, preferably 30 microns through 400 microns. On the other hand, the range of height of protuberance is 5 microns through 70 microns, preferably 20 microns through 40 microns.

| | Average Distance Between Two Particles | | | | Average Height Of Protuberance | | | |
|---|---|---|---|---|---|---|---|---|
| Range (microns) | 5–30 | 30–400 | 400–1000 | over 1000 | 5–20 | 20–40 | 40–70 | over 70 |
| Nature of non-bottoming | Fair | Good | Fair | No Good | Fair | Good | Fair | No Good |

Of course, it should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

We claim:

1. A shallow relief, non-bottoming printing plate comprising a water-developable photopolymerized layer having a thickness less than 0.020 inch and supported on a substrate, and a binder layer having a thickness from about 5 to 60 microns and carrying a plurality of dispersed ink repellant, polytetrafluroethylene particles interposed between said substrate and said photopolymerized layer, said binder layer being selected from the group consisting of (a) styrene-butadiene copolymers, (b) polyesters, (c) glyoxal, or mixtures of (a), (b), or (c), with partially hydrolyzed polyvinyl acetate, said photopolymerized layer having raised image areas and recessed background areas, and said dispersed particles being present in said binder layer in a size and concentration sufficient to create an array of protuberances in the background areas having an average height between about 5 to 70 microns and an average distance between protuberances of about 5 to 1000 microns.

2. The printing plate of claim 1 wherein said dispersed particles are of a size to form protuberances in the background areas having a height between about 20 to 40 microns.

3. The printed plate of claim 2 wherein said dispersed particles are present in sufficient concentration to provide an array of protuberances in the background areas of the plate having an average distance between protuberances of between about 30 to 400 microns.

4. A shallow relief, non-bottoming printing plate comprising a water-developable photopolymerized layer having a thickness less than 0.020 inch and supported on a substrate, and a binder layer having a thickness from about 5 to 60 microns and carrying a plurality of dispersed ink repellant particles interposed between said substrate and said photopolymerized layer, said photopolymerized layer having raised image areas and recessed background areas;

said dispersed particles being present in said binder layer in a size and concentration sufficient to create an array of protuberances in the background areas of said plate having an average height between about 5 to 70 microns and an average distance between protuberances of between about 5 to 1000 microns; and said binder layer being selected from the group consisting of (a) styrene-butadiene copolymers, (b) polyesters, (c) glyoxal, or mixtures of (a), (b), or (c), with partially hydrolyzed polyvinyl acetate, said binder layer also having one or more antihalation compositions uniformly dispersed throughout.

5. The printing plate of claim 4 wherein said photopolymerizable layer has a thickness in the range of about 0.0009 to 0.016 inch, wherein said binder layer has an overall thickness less than the average height of said dispersed particles, and wherein said dispersed particles are polytetrafluroethylene.

* * * * *